(12) United States Patent
Holzmann

(10) Patent No.: US 10,484,005 B1
(45) Date of Patent: Nov. 19, 2019

(54) METHOD AND APPARATUS OF AN ACOUSTIC ENERGY DETECTION CIRCUIT FOR A PULSE DENSITY MODULATION MICROPHONE

(71) Applicant: Nuvoton Technology Corporation, Hsinchu (TW)

(72) Inventor: Peter Holzmann, San Jose, CA (US)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 16/380,968

(22) Filed: Apr. 10, 2019

(51) Int. Cl.
| | |
|---|---|
| H03M 1/66 | (2006.01) |
| H03M 7/32 | (2006.01) |
| H03G 3/30 | (2006.01) |
| G10L 21/0232 | (2013.01) |
| H04R 19/04 | (2006.01) |
| H04R 1/02 | (2006.01) |
| H04R 3/12 | (2006.01) |
| H04R 3/00 | (2006.01) |
| H04R 19/01 | (2006.01) |
| H03F 3/68 | (2006.01) |

(52) U.S. Cl.
CPC ....... *H03M 7/3042* (2013.01); *G10L 21/0232* (2013.01); *H03G 3/301* (2013.01); *H04R 19/04* (2013.01); *H03F 3/68* (2013.01); *H03M 1/66* (2013.01); *H04R 1/02* (2013.01); *H04R 3/00* (2013.01); *H04R 3/12* (2013.01); *H04R 19/016* (2013.01)

(58) Field of Classification Search
CPC .. H03M 1/66; H04R 1/02; H04R 3/12; H04R 19/016; H04R 3/00; H03F 3/68
USPC ............. 341/144; 381/122, 91, 113, 120, 80
See application file for complete search history.

(56) References Cited

U.S. PATENT DOCUMENTS

2011/0064246 A1 * 3/2011 Loeppert ............. H03G 1/0088
381/107

* cited by examiner

*Primary Examiner* — Joseph J Lauture
(74) *Attorney, Agent, or Firm* — Kilpatrick Townsend & Stockton LLP

(57) ABSTRACT

A PDM (pulse density modulation) signal energy detection circuit includes a digital-to-analog converter circuit for receiving a PDM digital input signal and producing an analog output signal based on the PDM digital input signal. The PDM signal energy detection circuit also includes a comparator circuit for receiving the analog output signal from the digital-to-analog converter circuit and producing a pulsed signal when a magnitude of the analog output signal exceeds a pre-set threshold. The PDM signal energy detection circuit also has a counter circuit for receiving the pulsed signal from the comparator circuit and producing an energy detection signal when a number of consecutive pulsed signals exceed a pre-set count.

20 Claims, 11 Drawing Sheets

METHOD AND APPARATUS OF AN ACOUSTIC ENERGY DETECTION CIRCUIT FOR A PULSE DENSITY MODULATION MICROPHONE

BACKGROUND OF THE INVENTION

This invention relates to pulse density modulation (PDM) microphone interface circuits, and, in particular, to low-power interface circuits for voice activity detection in mobile voice command applications.

Pulse-density modulation, or PDM, is a form of modulation used to represent an analog signal with a binary signal. In a PDM signal, the relative density of the pulses corresponds to the analog signal's amplitude. For example, a PDM encoding of an audio signal can be similar to the output of a 1-bit digital-to-analog converter (DAC). PDM encoding is often used in digital telephones.

Voice command applications in mobile devices are becoming more popular. The circuits that process audio signals detected by the microphone often consumes substantial power, because these circuits are typically always running as a voice command or keyword that can arrive at any time. For power efficient implementation and long battery life, it is desirable to have very low power circuits that process audio signals detected by the microphone.

BRIEF SUMMARY OF THE INVENTION

In a digital microphone, or a pulse density modulation (PDM) telephone, the PDM data is typically processed by a digital processor for acoustic activity detection and/or voice keyword detection. It is highly undesirable to leave the digital processor powered up at all times as it consumes power due to leakage and dynamic switching. In addition, power supply regulators are typically required to operate such digital processors. Therefore, in some embodiments of the invention, a low-power PDM energy detection interface circuit is inserted to power up the processor once acoustic energy is detected. In some embodiments, the PDM energy detection circuit includes cascaded filter stages, each filter stage having a switched-capacitor circuit having only one active transistor, e.g., a field effect transistor (FET), for low power consumption. In contrast, conventional switched capacitor circuits are often built with more sophisticated amplifiers for performance and quality, and not for lower power consumption. For example, in some embodiments of the invention, the simulated average current consumed is 3.6 uA with no signal and 4.9 uA with a signal close to full scale. In contrast, conventional voice activity detectors often consume 25 uA or more.

According to some embodiments of the present invention, a PDM (pulse density modulation) signal energy detection circuit includes a multiple-stage switched-capacitor filter circuit for receiving a PDM digital input signal. The multiple-stage switched-capacitor filter circuit produces a non-inverting analog output signal and an inverting analog output signal based on the PDM digital input signal. A comparator circuit in the PDM signal energy detection circuit receives the non-inverting analog output signal and the inverting analog output signal from the multiple-stage switched-capacitor filter circuit, and produces a pulsed signal when a magnitude of the non-inverting analog output signal or the inverting analog output signal exceeds a pre-set threshold. A counter circuit receives the pulsed signal from the comparator circuit and produces an energy detection signal when a number of consecutive pulsed signals exceeds a pre-set count.

In some embodiments of the above circuit, the filter stages each comprises of a single MOSFET gain stage, a MOSFET current source carrying a current Ibias and a switched capacitor network, the single MOSFET gain stage being biased at a current Ibias and having an average voltage of Vnbias at a drain and gate connection, wherein Vnbias is a bias voltage derived from an external MOSFET gate voltage having drain and gate tied together and biased at a current Ibias.

Some embodiments of the above circuit can include an input sampling filter stage and an output filter stage. In some embodiments, there can be one or more intermediate filter stages coupled between the input sampling filter stage and the output filter stage. Each of the intermediate filter stages is a switched-capacitor low-pass filter.

In some embodiments, the input sampling filter stage is configured to sample an input voltage Vnbias through switches controlled by the PDM digital input signal, where Vnbias is a bias voltage derived from a field-effect transistor (FET) gate to source voltage. The input sampling filter stage is configured to produce a full scale output voltage of $$Vnbias \pm \left(2 \times \frac{Dp - 50}{100}\right) \times Vnbias,$$

where Dp is the density of the pulses of the PDM digital input signal, expressed as a percentage.

In some embodiments, the input sampling filter stage includes an MOSFET for receiving a bias current from a current source and a plurality of capacitors. The plurality of capacitors includes a feedback capacitor coupling a drain and a gate of the MOSFET, a switching capacitor coupled to the feedback capacitor, and a sampling capacitor coupled to the switching capacitor and the feedback capacitor. The input sampling filter stage also includes a plurality of switches for coupling the sampling capacitor, the switching capacitor, and the feedback capacitor. The sampling capacitor is configured to receive a PDM (pulse density modulation) digital data signal. The input sampling filter stage is configured to produce an analog signal with a magnitude that is based on a density of the PDM digital input signal.

In some embodiments, the input sampling filter stage is configured to be a low-pass filter with a cut-off frequency of:

$$Fc = 1 \bigg/ \left(2\pi \times Cfb \times \frac{Tdmclk}{Csw}\right)$$

where:
Cfb is the capacitance of the feedback capacitor;
Csw is the capacitance of the switching capacitor; and
Tdmclk is a clock period of the PDM digital input signal.

In some embodiments, the output filter stage includes a first switched capacitor output filter and a second switched capacitor output filter. The output filter stage is configured to receive an input signal from a previous stage and to produce the non-inverter output analog signal and the inverting analog output signal.

In some embodiments, each filter stage of the multiple-stage switched-capacitor filter circuit includes an MOSFET for receiving a bias current from a current source, a feedback capacitor coupling a drain and a gate of the MOSFET, a switching capacitor coupled to the feedback capacitor, a sampling capacitor coupled to the switching capacitor and the feedback capacitor, and a plurality of switches for coupling the sampling capacitor, the switching capacitor, and the feedback capacitor. In some embodiments, each filter stage of the multiple-stage switched-capacitor filter circuit is configured to be a low-pass filter with a cut-off frequency of:

$$Fc = 1 \bigg/ \bigg(2\pi \times Cfb \times \frac{Tdmclk}{Csw}\bigg)$$

where:
Cfb is the capacitance of the feedback capacitor;
Csw is the capacitance of the switching capacitor; and
Tdmclk is a clock period of the PDM digital input signal.

In some embodiments, the comparator circuit comprises a comparator and a latch. The comparator includes first and second input NMOS transistors coupled in parallel at drain terminals and source terminals. The first input NMOS transistor has a gate terminal for receiving the non-inverting output analog signal, and the second input NMOS transistor has a gate terminal configured for receiving the inverting output analog signal. The comparator circuit also has a source resistor coupled to the source terminals of the first and second input NMOS transistors and providing a voltage Vres that represents a rectified signal based on the non-inverting analog output signal or the inverting analog output signal. The comparator circuit also has a programmable resistor Rp coupled to the drain terminals of the first and second NMOS transistors. The latch is configured to produce the pulsed signal when a magnitude of the rectified signal exceeds a threshold.

According to some embodiments of the present invention, a PDM (pulse density modulation) signal energy detection circuit includes a digital-to-analog converter circuit for receiving a PDM digital input signal and producing an analog output signal based on the PDM digital input signal. A comparator circuit is coupled to the digital-to-analog converter circuit for receiving the analog output signal from the digital-to-analog converter circuit and producing a pulsed signal when a magnitude of the analog output signal exceeds a pre-set threshold. A counter circuit is coupled to the comparator circuit for receiving the pulsed signal from the comparator circuit and producing an energy detection signal when a number of consecutive pulsed signals exceed a pre-set count. In some embodiments, the digital-to-analog converter circuit comprises a single MOSFET gain stage, a MOSFET current source carrying a current Ibias and a switched capacitor network, the single MOSFET gain stage being biased at a current Ibias and having an average voltage of Vnbias at a drain and gate connection, wherein Vnbias is a bias voltage derived from an external MOSFET gate voltage having drain and gate tied together and biased at a current Ibias.

In some embodiments, the filter circuit is configured to sample an input voltage Vnbias through switches controlled by the PDM digital input signal, where Vnbias is a bias voltage derived from a field-effect transistor (FET) gate to source voltage. The filter circuit is configured to produce an output voltage of $$Vnbias \pm \bigg(2 \times \frac{Dp-50}{100}\bigg) \times Vnbias,$$

where Dp the density of the pulses of the PDM digital input signal, expressed as a percentage.

In some embodiments, the filter circuit has a switched-capacitor circuit that includes an MOSFET for receiving a bias current from a current source, a feedback capacitor coupling a drain and a gate of the MOSFET, a switching capacitor coupled to the feedback capacitor, a sampling capacitor coupled to the switching capacitor and the feedback capacitor, and a plurality of switches for coupling the sampling capacitor, the switching capacitor, and the feedback capacitor. The sampling capacitor is configured to receive a PDM (pulse density modulation) digital data signal. The filter circuit is configured to produce an analog signal with a magnitude that is based on a density of the PDM digital data signal.

In some embodiments, the filter circuit is configured to be a low-pass filter with a cut-off frequency of:

$$Fc = 1 \bigg/ \bigg(2\pi \times Cfb \times \frac{Tdmclk}{Csw}\bigg)$$

where:
Cfb is a capacitance of the feedback capacitor;
Csw is a capacitance of the switching capacitor; and
Tdmclk is a clock period of the PDM digital input signal.

In some embodiments, the filter circuit is configured to produce a non-inverting analog output signal and an inverting analog signal.

Some embodiments provide a circuit for receiving a PDM digital input signal and producing an analog output signal based on the PDM digital input signal. The circuit includes an MOSFET for receiving a bias current from a current source and a plurality of capacitors coupled to the MOSFET. The circuit is configured to sample an input voltage Vnbias through switches controlled by the PDM digital input signal, wherein Vnbias is a bias voltage derived from a gate-to-source voltage of the MOSFET. The circuit is configured to produce an analog output voltage with a magnitude that is based on a density of the PDM digital input signal. The analog output voltage can be expressed as follows.

$$Vnbias \pm \bigg(2 \times \frac{Dp-50}{100}\bigg) \times Vnbias,$$

where Dp is a density of the PDM digital input signal.

In some embodiments, the circuit includes a feedback capacitor coupling a drain and a gate of the MOSFET, a switching capacitor coupled to the feedback capacitor, a sampling capacitor coupled to the switching capacitor and the feedback capacitor, a plurality of switches for coupling the sampling capacitor, the switching capacitor, and the feedback capacitor.

In some embodiments, the circuit is configured to be a low-pass filter with a cut-off frequency of:

$$Fc = 1 \bigg/ \bigg(2\pi \times Cfb \times \frac{Tdmclk}{Csw}\bigg)$$

where:
Cfb is the capacitance of the feedback capacitor;
Csw is the capacitance of the switching capacitor; and
Tdmclk is a clock period of the PDM digital input signal.

The following description, together with the accompanying drawings, provides further information of the nature and advantages of the claimed invention.

DETAILED DESCRIPTION OF THE INVENTION

In voice detection applications, the sequence for activating the voice command processing can be described as follows:

1) Acoustic energy detection. This detects any incoming sound energy and, if detected, it can enable the circuits required for further discrimination between voice energy and other sounds in step 2). The circuit used for the acoustic energy detection includes the low power pulse density modulation microphone interface circuit as described in this application. The first stage triggers subsequent stages, which consume more power;

2) Voice detection. This can be done by an algorithm or circuit that needs to reject noise and music, but flag voice inputs. If a voice is detected, then the keyword detection in step 3) is initiated;

3) Keyword detection. This detects if the voice input contains a system keyword (like 'Siri,' 'Ok Google,' 'Alexa') required for voice commands. If the keyword is detected, then voice command processing in step 4) is initiated;

4) Voice command processing. This can be carried out on an external server and is system-dependent;

Every step described above is often gated, such that the most power or data consuming steps are less likely to be triggered by false sound triggers. This allows the mobile system to operate at low power. Some embodiments of the invention can handle the digital microphone circuit for acoustic energy detection, which is often enabled continuously, and, therefore, its power dissipation is critical.

Once acoustic energy is detected, powering up the processor can take time. Therefore, in some embodiments, the PDM data is buffered in a FIFO (first in first out) register, which is long enough to cover the power up time. The PDM energy detection interface circuit, FIFO, and the oscillator can be activated at all times and at a very low power. Therefore, in embodiments of the invention, these circuits can derive the power directly from the supply voltage without use of power regulators, such as low-dropout (LDO) regulators.

Figure 1:
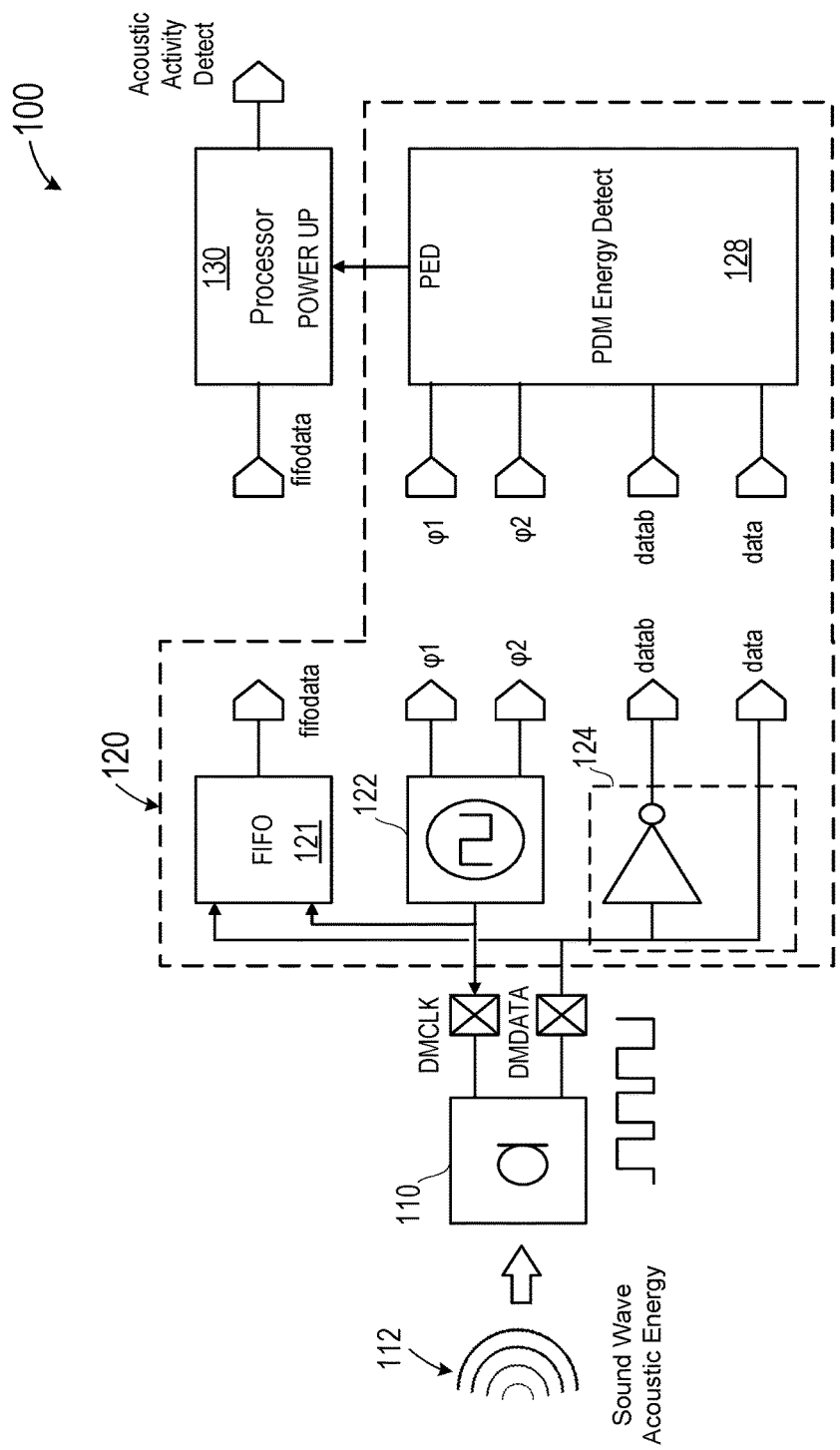
FIG. 1 is a block diagram illustrating a digital audio system according to some embodiments of the present invention.

FIG. 1 is a block diagram illustrating a digital audio system according to some embodiments of the present invention. Referring to FIG. 1, the digital audio system 100 includes an external digital microphone module 110, a low-power Pulse Density Modulation (PDM) microphone interface circuit 120, and a processor 130. The processor can be a digital signal processor or general purpose processor, etc. The low-power Pulse Density Modulation (PDM) microphone interface circuit 120 includes a clock generation module 122, a data interface 124, a storage unit 121, and a PDM signal energy detection circuit 128.

A digital microphone module typically includes a MEMS microphone and a PDM modulator, which can include a sigma delta analog-to-digital converter (ADC). In addition to power and ground connections for its power supply, the digital microphone module also receives a clock signal. The digital microphone module 110 in FIG. 1 captures an external audio signal 112 and provides a PDM digital signal DMDATA. The PDM output data is synchronous to a digital microphone clock DMCLK provided by clock generation module 122.

Clock generation module 122 can be a low-power oscillator circuit, e.g., an oscillator using less than 1 uA of supply current. The clock generation module 122 provides the digital microphone clock DMCLK to the digital microphone module 110. The clock source 122 also provides non-overlapping clock signals phase 1 ($\varphi 1$) and phase 2 ($\varphi 2$) used in the PDM signal energy detection circuit 128 as described in a section below.

Data interface 124 provides PDM digital audio input signals "data" and its complement "datab." The storage unit 121 may be a first-in-first-out (FIFO) buffer for storing the digital audio signal DMDATA from the external digital microphone module 110, so as to prevent data from being lost, e.g., during low-power voice activity detection mode and before the process is powered up in response to the PDM signal energy detection circuit 128. FIFO 121 provides data "fifodata" to a processor 130, which can generate an acoustic activity detected signal.

Figure 2:
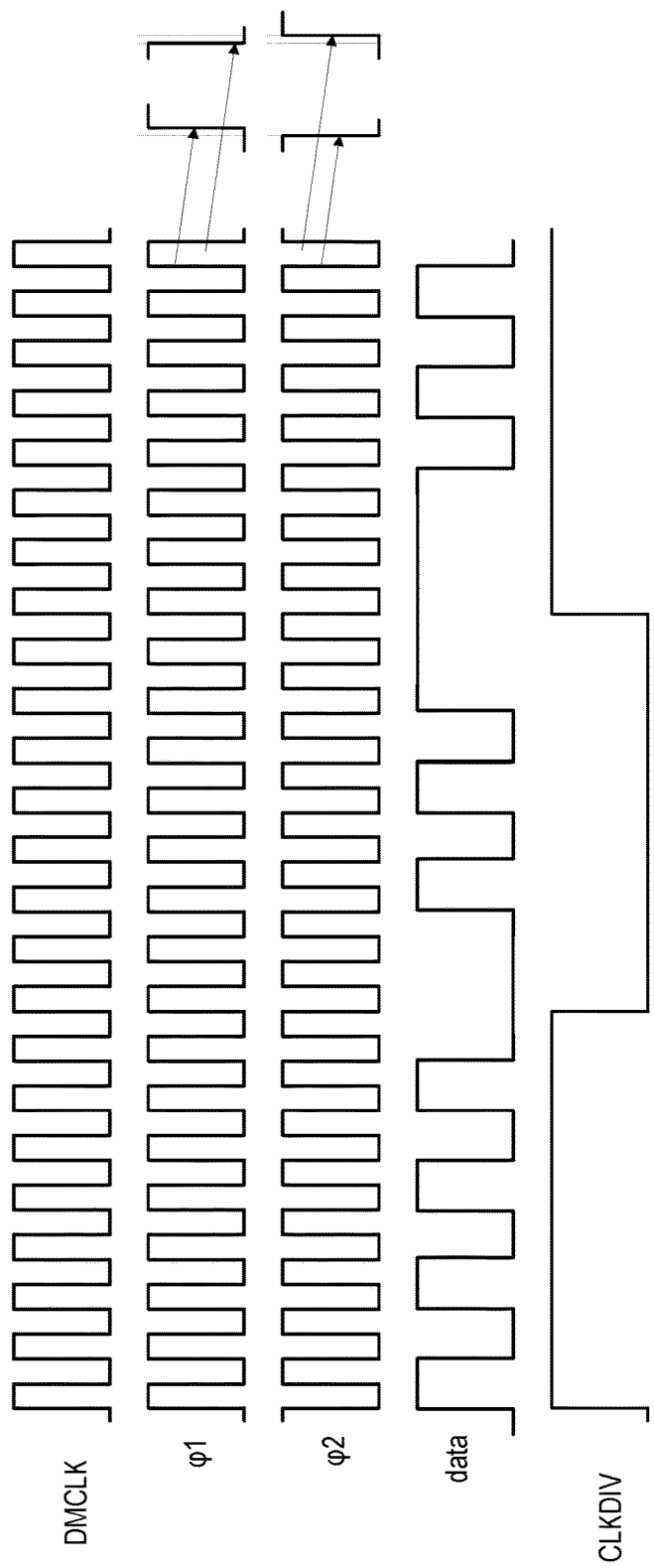
FIG. 2 is a waveform diagram illustrating various signals used in the digital audio system of FIG. 1 according to some embodiments of the present invention.

FIG. 2 is a waveform diagram illustrating various signals used in the digital audio system 100 according to some embodiments of the present invention. As shown in FIG. 2, DMCLK is the digital microphone clock provided by clock generation module 122. Non-overlapping clock phases phase 1 ($\varphi 1$) and phase 2 ($\varphi 2$) are derived from DMCLK and used in the PDM signal energy detection circuit 128 as described below. The inserts to the right of $\varphi 1$ and $\varphi 2$ show the non-overlapping the clock signals. CLKDIV is a divided clock derived from DMCLK and having a lower frequency. In FIG. 2, the waveform labeled "data" illustrates an example of PDM digital audio input signal, synchronized to the digital microphone clock DMCLK. The density of the PDM data represents the magnitude of the audio signal detected by the microphone module.

Figure 3:
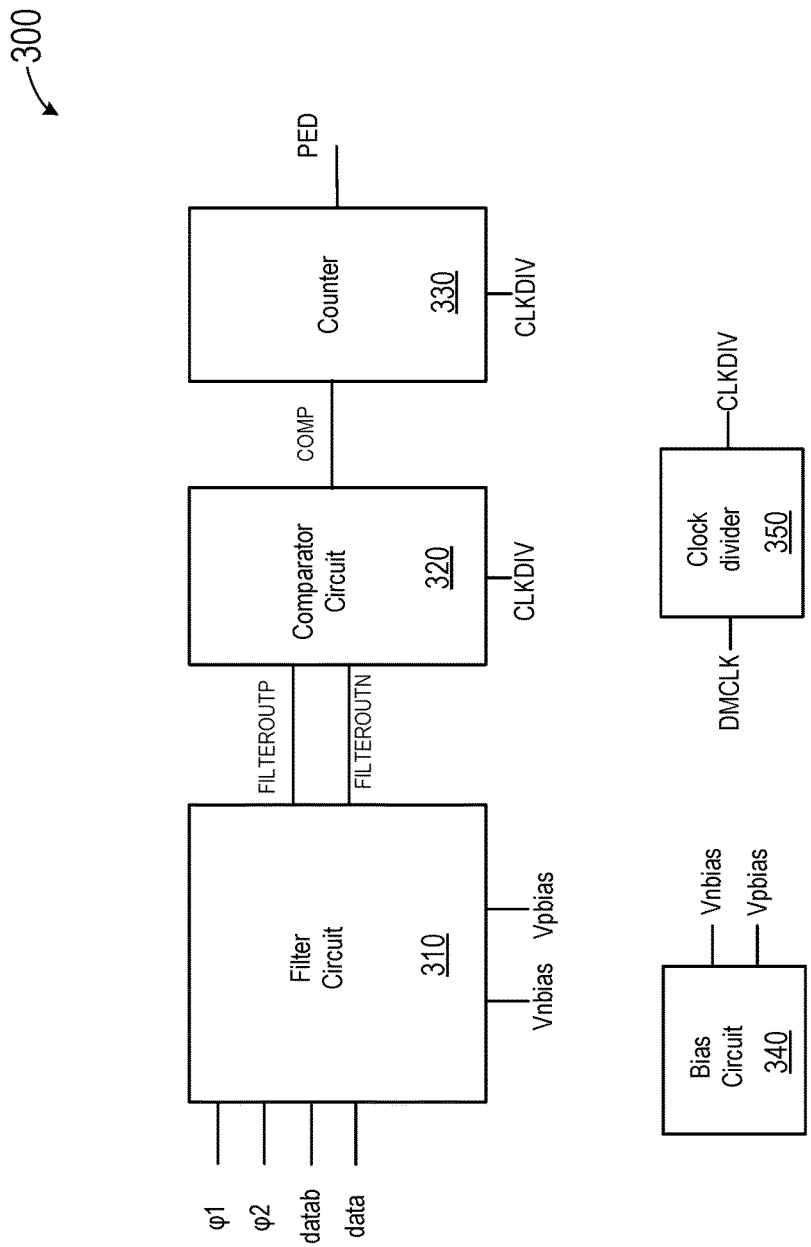
FIG. 3 is a block diagram of a PDM (pulse density modulation) signal energy detection circuit according to some embodiments of the present invention.

FIG. 3 is a block diagram of a PDM (pulse density modulation) signal energy detection circuit according to some embodiments of the present invention. As shown in FIG. 3, a PDM signal energy detection circuit 300 includes a multiple-stage switched-capacitor filter circuit 310 for receiving a PDM digital input signal "data" and its complement "datab." The multiple-stage switched-capacitor filter circuit 310 is configured to produce a non-inverting analog output signal FILTEROUTP and an inverting analog output signal FILTEROUTN based on the PDM digital input signal.

The PDM signal energy detection circuit 300 also includes a comparator circuit 320 for receiving the non-inverting analog output signal FILTEROUTP and the inverting analog output signal FILTEROUTN from the multiple-stage filter circuit 310. The comparator circuit 320 is configured to produce a pulsed signal COMP, when a magnitude of the non-inverting analog output signal FILTEROUTP or the inverting analog output signal FILTEROUTN exceeds a pre-set threshold. The PDM signal energy detection circuit 300 also includes a counter circuit 330 for receiving the pulsed signal COMP from the comparator circuit 320 and producing PDM energy detection signal PED, when a number of consecutive pulsed signals exceed a pre-set count.

As shown in FIG. 3, a PDM signal energy detection circuit 300 can also include a bias circuit 340 and a clock divider 350. Bias circuit 340 provides two bias voltages Vnbias and Vpbias that are used by the multiple-stage filter circuit 310. Clock divider 350 provides the divided clock signal CLKDIV, which are used by comparator circuit 320 and counter circuit 330. For example, the PDM clock can be a 512 KHz clock, and the divided clock signal CLKDIV can be running at one eighth or one sixteenth of the frequency of the PDM clock.

In some embodiments, the multiple-stage switched-capacitor filter circuit 310 can be implemented using switched-capacitor filter circuits, which are controlled by non-overlapping clocks ($\varphi 1$) and phase 2 ($\varphi 2$).

As described above, the multiple-stage switched-capacitor filter circuit 310 is configured to produce a non-inverting analog output signal FILTEROUTP and an inverting analog output signal FILTEROUTN based on the PDM digital input signal. Therefore, the multiple-stage switched-capacitor filter circuit 310 is also referred to as a digital-to-analog converter (DAC), which can convert a PDM digital input signal into an analog signal.

Figure 4:
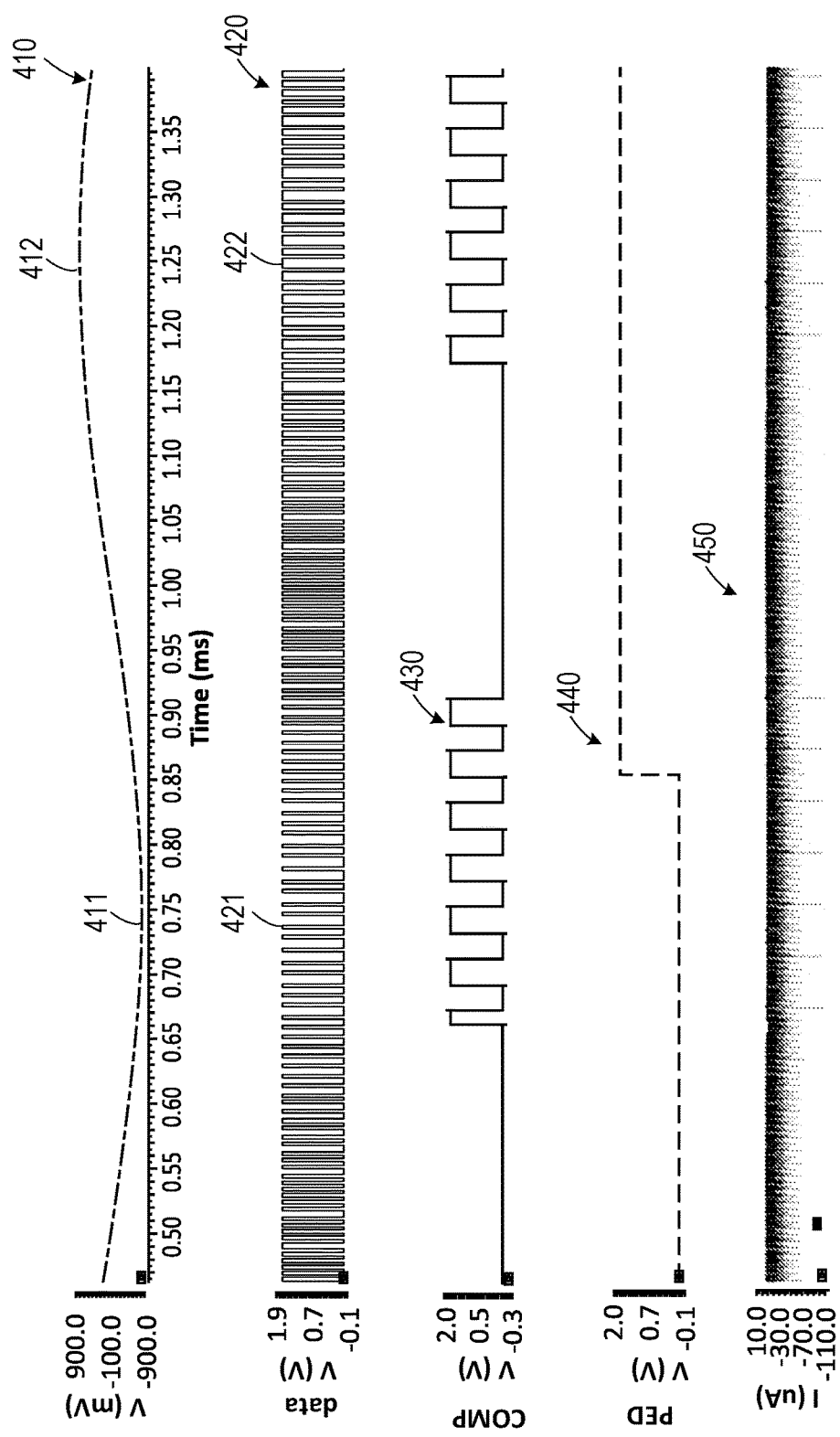
FIG. 4 is a waveform diagram illustrating waveforms of various signals used in the operation of the PDM signal energy detection circuit of FIG. 3.

FIG. 4 is a waveform diagram illustrating waveforms of various signals used in the operation of the PDM signal energy detection circuit of FIG. 3. In FIG. 4, waveform 410 illustrates the simulated audio input signal into the PDM microphone. Waveform 420 illustrates the PDM signal DMDATA produced by microphone module 110 based on the external audio signal represented by waveform 410. In this example, the point of negative maximum 411 of external audio signal 410 corresponds to a point 421 in PDM signal 420, where the PDM pulses have the lowest density. In contrast, the maximum 412 of external audio signal 410 corresponds to a point 422 in PDM signal 420, where the PDM pulses have the highest density. Waveform 430 illustrates the COMP signal output pulses from the comparator circuit 320 in FIG. 3, which indicates that the magnitude of the external audio signal exceeds a pre-set threshold. Waveform 440 illustrates the PED signal from the counter circuit 330 in FIG. 3, which indicates that the number of consecutive COMP signals has reached a pre-set count. The pre-set threshold and the pre-set count can be selected to trigger a detection signal when a desired amount of external audio energy has been detected.

Waveform 450 illustrates the supply current to a PED energy detection circuit according to some embodiments of the present invention. Waveform 450 shows that the average current consumed is 3.6 uA with no signal and 4.9 uA with a signal close to full scale. In contrast, conventional voice activity detectors often consume 25 uA or more. Conventional solutions may use different combinations of blocks in the VAD path powered up at all times. The largest power is consumed when the fall path including the Audio DSP is enabled.

Figure 5:
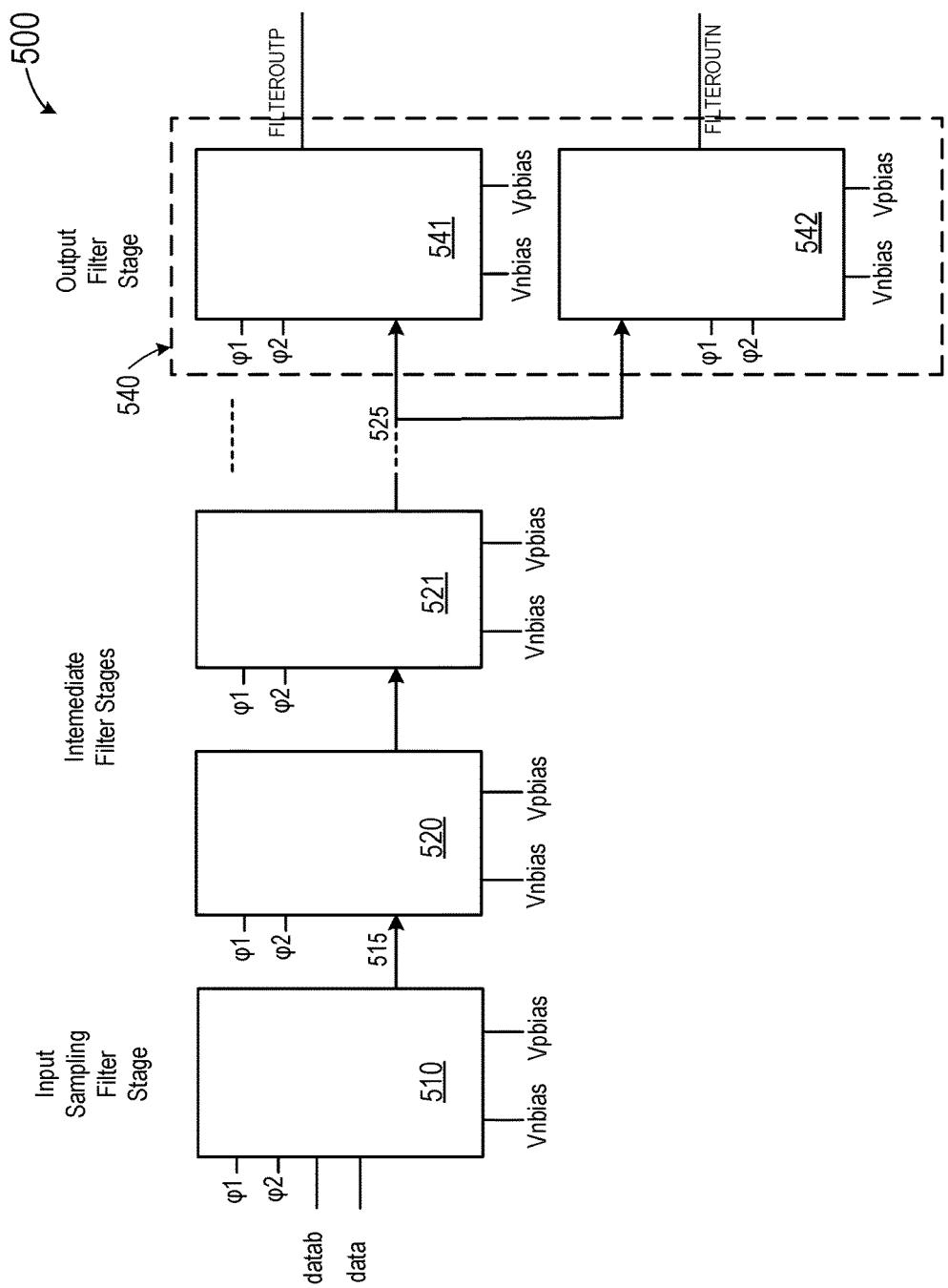
FIG. 5 is a block diagram illustrating a filter circuit according to some embodiments of the present invention.

FIG. 5 is a block diagram illustrating a filter circuit according to some embodiments of the present invention. Filter circuit 500 depicted in FIG. 5 is an example of filter circuit that can be used as filter circuit 310 in FIG. 3. In the embodiment of FIG. 5, filter circuit 500 includes an input sampling filter stage 510 and an output filter stage 540. In some embodiments, filter circuit 500 can also have one or more intermediate filter stages 520, 521, etc., coupled between the input sampling filter stage 510 and the output filter stage 540.

In FIG. 5, input sampling filter stage 510 receives input audio data signals "data" and "datab," which represent the PDM signals. Input sampling filter stage 510 also receives clock signals $\varphi 1$ and $\varphi 2$, as well as bias voltages Vnbias and Vpbias described above. Input sampling filter stage 510 provides an output analog signal 515 based on the input audio data signals "data" and "datab." Intermediate stages 520, 521, etc., each also receive clock signals $\varphi 1$ and $\varphi 2$, as well as bias voltages Vnbias and Vpbias.

Intermediate stages 520, 521, etc., receive the output signal 515 from input sampling filter stage 510 and provide an output analog signal 525 to the output filter stage 540. Output filter stage 540 includes two filer stages 541 and 542 operating on different clock phases, and produces a non-inverting output signal FILTEROUTP and an inverting output signal FILTEROUTN. In some embodiments, each of the input sampling filter stage 510, the intermediate filter stages 520, and the output filter stage 540 is a switched-capacitor low-pass filter. The functions of the filter stages are described below with reference to FIGS. 6-8.

In some embodiments, filter circuit 500 can include cascaded filter stages. Each filter stage can be a first order filter built on a single transistor, which can provide advantages such as low power and small size. In some embodiments, every filter stage has a fixed capacitor Csw between a drain and a gate of the transistor. In some embodiments, the single transistor in each filter stage can be an N-type field effect transistor (FET), and the transistor can be the same as the FET used to generate the Vnbias bias voltage. As a result, all the average drain and gate voltages are at Vnbias. This arrangement can force the average drain-to-gate voltage VDG drop between drain and gate at each stage to be the same. This configuration can simplify signal processing, as described in detail in the sections below.

Figure 6:
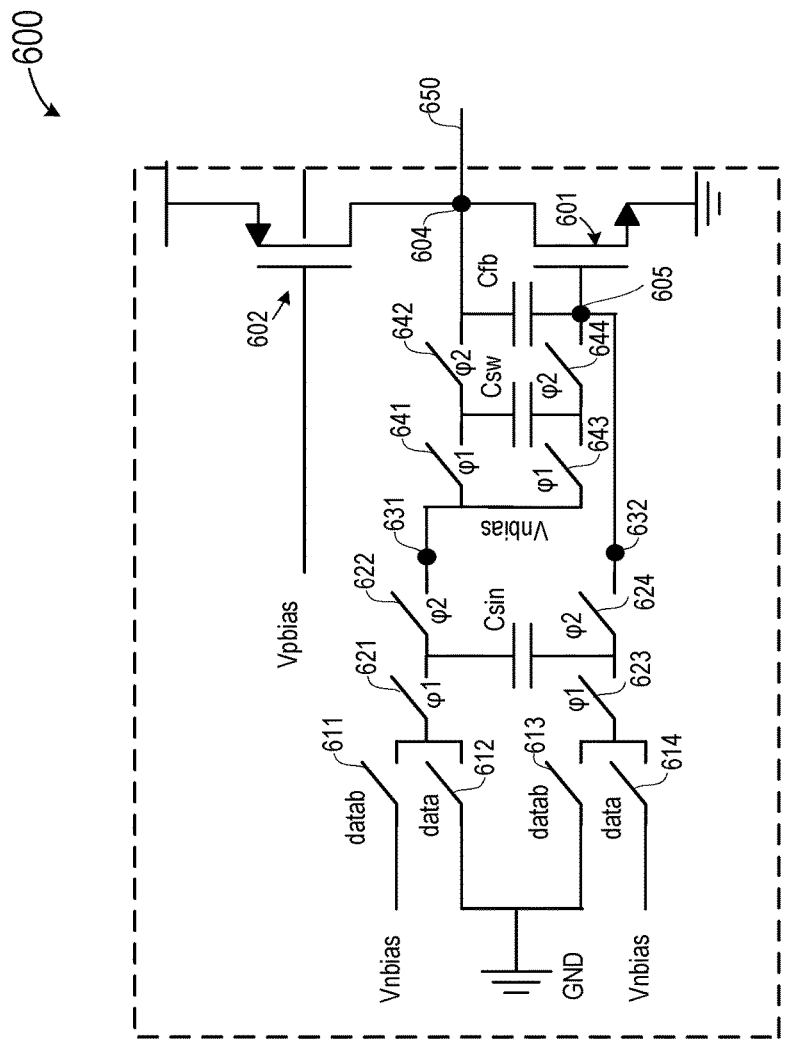
FIG. 6 is a circuit diagram illustrating an input sampling filter according to some embodiments of the present invention.

FIG. 6 is a circuit diagram illustrating an input sampling filter according to some embodiments of the present invention. Input sampling filter 600 is an example of a filter circuit that can be used as the input sampling filter stage 510 in FIG. 5 that can be used in the PDM energy detection circuit described above. In this embodiment, input sampling filter 600 is a switched capacitor input sampling and filtering circuit. As shown in FIG. 6, input sampling circuit 600 includes an NMOS transistor 601 coupled to a current source provided by a PMOS transistor 602. Input sampling circuit 600 also includes an input sampling capacitor Csin, a switching capacitor Csw, and a feedback capacitor Cfb. Feedback capacitor Cfb is coupled to a drain 604 and a gate 605 of transistor 601. Note that input sampling filter 600 has only one active transistor, i.e., MOSFET transistor 601. PMOS transistor 602 is biased at a fixed bias to function as a current source. The only active transistor 601 is also referred to as a single MOSFET gain stage.

Input data signals "data" and "datab" are sampled by input sampling capacitor Csin through switches 611, 612, 613, 614, 621, 623, 622, and 624. Input sampling capacitor Csin is coupled to a bias voltage "+Vnbias" through switches 611, 612, and 621, and input sampling capacitor Csin is coupled to a bias voltage "−Vnbias" through switches 613, 614, and 623. Vnbias is the gate to source voltage of a reference NMOS device receiving a fixed bias current and having the drain and gate tied together. Switches 611 and 613 are coupled to a ground terminal GND. Switches 611 and 613 are controlled by data signal "datab," and switches 612 and 614 are turned on by data signal "data." Switches 621, 623, 622, and 624 are controlled by non-overlapping clocks φ1 and φ2 described above, respectively. In this example, switch 622 is connected through node 631 to a fixed bias Vnbias under the control of the phase 2 (φ2) clock. Just at the start of phase 2 (φ2), one side of the input sampling capacitor will be forced to Vnbias by switch 622. Since the input sampling capacitor is charged to +Vnbias (data=1) or −Vnbias (datab=1) during phase 1 (φ1), at the start of phase 2 (φ2), the other side of the input sampling capacitor will be at Vnbias+Vnbias=2Vnbias or Vnbias−Vnbias=0, allowing the full signal swing to be 2×Vnbias.

The output signal from input sampling capacitor Csin at nodes 631 and 632 is transferred to switching capacitor Csw and feedback capacitor Cfb through switches 641, 642, 643, and 644 under the control of non-overlapping clocks φ1 and φ2, respectively. Feedback capacitor Cfb is coupled to a drain 604 and a gate 605 of transistor 605. Therefore, the average drain-to-gate voltage of transistor 601 between nodes 604 and 605 has an average value of 0V. The average drain and gate voltages of transistor 601 have an average value of Vnbias. The output signal of the data sampling interface 600 is provided at node 604, and is designated as signal 650, which can be provided to the next filter stage.

First, the PDM data is sampled on sampling capacitor Csin, using the "data" and "datab" signals. The switched capacitor circuit is driven by non-overlapping clocks φ1 and φ2, as illustrated in FIG. 2. During phase 1 (φ1), the input sampling capacitor Csin is charged with "Vnbias" or "−Vnbias" depending on the polarity of the data signal "data" and "datab." "Vnbias" is the gate to source voltage of a reference NMOS device receiving a fixed bias current and having the drain and gate tied together. During phase 2 (φ2), the input sampling capacitor Csin is connected to the input of a first order switched capacitor filter stage including the switching capacitor Csw and the feedback capacitor Cfb.

The filter stage is designed using a single NMOS device and a current source, allowing for minimal power dissipation. The NMOS feedback switched capacitor Csw between the gate and drain nodes of NMOS transistor 601 forces the average drain and gate voltage to be equal. The fixed feedback capacitor Cfb will hold the gate charge and provides a low pass cut-off. For each stage, a PMOS transistor 602 serving as a current source 602, along with NMOS transistor 601, provides a DC gain of:

$$Adc = gmn \times \left(\frac{rdsn \times rdsp}{rdsn + rdsp}\right)$$

where:
gmn is the transconductance of the NMOS device,
rdsn is the output resistance of the NMOS device and
rdsp is the output resistance of the PMOS device.

The filter stage provides a low-pass response with a cut-off frequency at about:

$$Fc = 1 \bigg/ \left(2\pi \times Cfb \times \frac{Tdmclk}{Csw}\right).$$

As described above, the input sampling filter stage is configured to sample an input voltage +Vnbias or −Vnbias through switches controlled by the PDM digital input signal, wherein Vnbias is a bias voltage derived from a field-effect transistor (FET) gate to source voltage.

Figure 7:
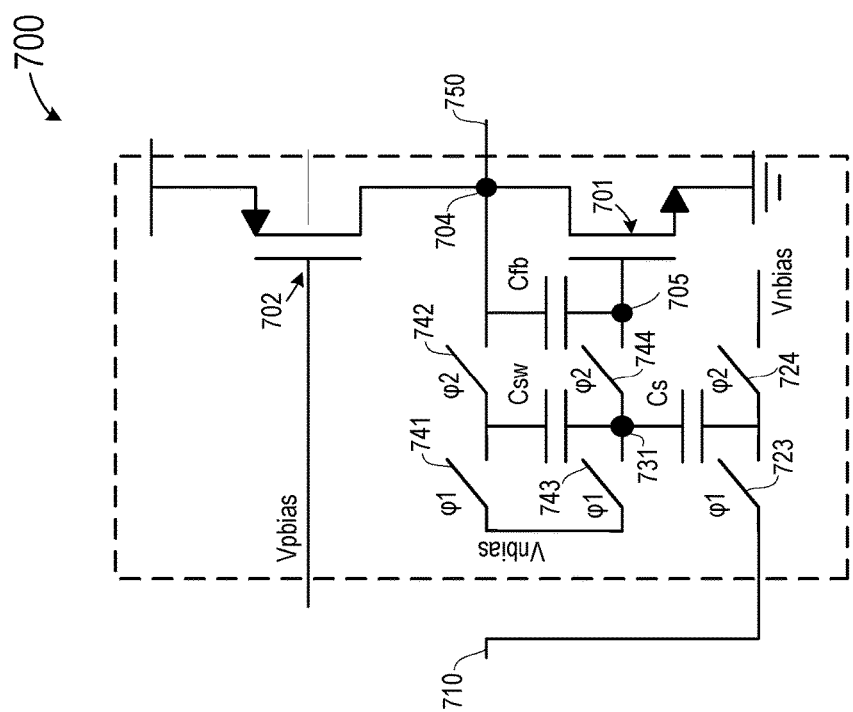
FIG. 7 is a circuit diagram of a filter circuit according to some embodiments of the present invention.

FIG. 7 is a circuit diagram of a filter circuit according to some embodiments of the present invention. Filter circuit 700 is an example of filters that can be used as an intermediate filter stage in the PDM energy detection circuit described above in connection with FIGS. 1-5. In this embodiment, filter circuit 700 is a switched capacitor filtering circuit. As shown in FIG. 7, filter circuit 700 includes an NMOS transistor 701 coupled to a current source provided by a PMOS transistor 702, which is biased at Vpbias. Filter circuit 700 also includes an input sampling capacitor Cs, a switching capacitor Csw, and a feedback capacitor Cfb. Feedback capacitor Cfb is coupled to a drain 704 and a gate 705 of transistor 701. Note that filter circuit 700 has only one active transistor, i.e., MOSFET transistor 701, which is also referred to as a single MOSFET gain stage.

Input data signal 710 is sampled by input sampling capacitor Cs through switches 723 and 724. When filter circuit 700 is used as an intermediate filter stage, the input data signal 710 represents the output data signal from a previous filter stage. Switches 723 and 724 are controlled by non-overlapping clocks φ1 and φ2 described above, respectively. Switch 724 is coupled to bias voltage Vnbias.

The charges from input sampling capacitor Cs at node 731 are transferred to switching capacitor Csw and feedback capacitor Cfb through switches 741, 742, 743, and 744 under the control of non-overlapping clocks φ1 and φ2, respectively. Feedback capacitor Cfb is coupled to a drain 704 and a gate 705 of transistor 701. Therefore, the average drain-to-gate voltage of transistor 701 between nodes 704 and 705 has an average value of Vnbias. The output signal of the filter circuit 700 is provided at node 704, and is designated as signal 750, which can be provided to the next filter stage.

As described above, filter circuit 700 is a low-pass filter, and has similar DC gain and cut-off frequency as described above in connection with filter circuit 600 in FIG. 6.

Figure 8:
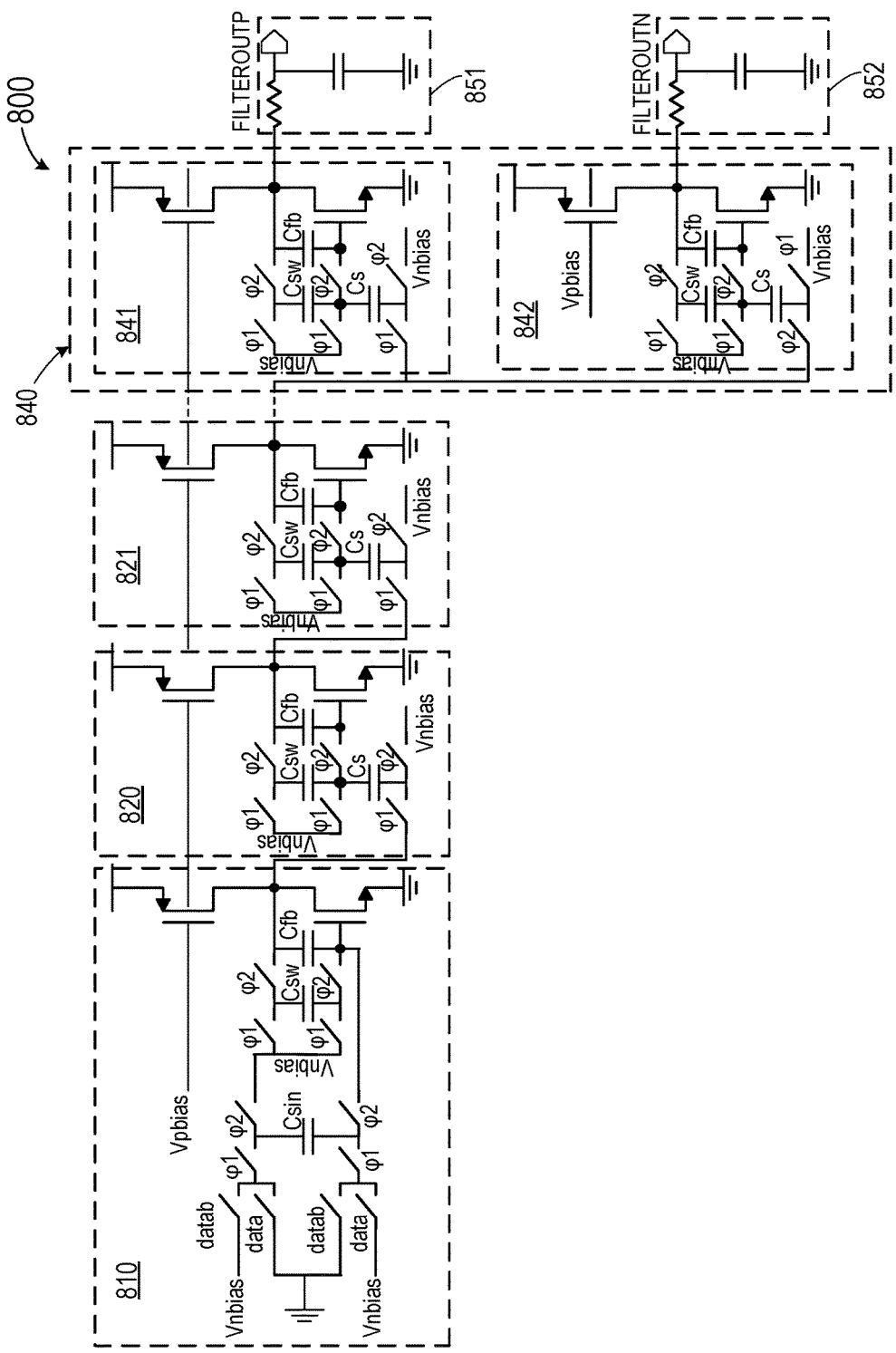
FIG. 8 is a circuit diagram illustrating a multiple-stage switched-capacitor filter circuit according to some embodiments of the invention.

FIG. 8 is a circuit diagram illustrating a multiple-stage switched-capacitor filter circuit according to some embodiments of the invention. Filter circuit 800 depicted in FIG. 8 is an example of circuit implementation of filter circuit 500 that can be used as filter circuit 310 in FIG. 3. As shown in FIG. 8, filter circuit 800 includes an input sampling filter stage 810 and an output filter stage 840. In some embodiments, filter circuit 800 can also have optionally one or more intermediate filter stages 820, 821, etc., coupled between the input sampling filter stage 810 and the output filter stage 840.

As shown in FIG. 8, input sampling filter stage 810 is similar to input sampling filter 600, and is configured to perform the function of input sampling filter stage 510 in FIG. 5. The input sampling filter stage 810 includes an MOSFET for receiving a bias current from a current source, a feedback capacitor coupling a drain and a gate of the MOSFET, a switching capacitor coupled to the feedback capacitor, and a sampling capacitor coupled to the switching capacitor and the feedback capacitor. Input sampling filter stage 810 includes a plurality of switches for coupling the sampling capacitor, the switching capacitor, and the feedback capacitor. In input sampling filter stage 810, the sampling capacitor is configured to receive a PDM (pulse density modulation) digital data signal. The input sampling filter stage is configured to produce an analog signal with a magnitude that is based on a density of the PDM digital input signal.

The input sampling filter stage 810 is configured to sample an input voltage Vnbias through switches controlled by the PDM digital input signals "data" and "datab," where Vnbias is a bias voltage derived from a field-effect transistor (FET) gate to source voltage. The input sampling filter stage is configured to produce an output voltage of:

$$Vnbias \pm \left(2 \times \frac{Dp-50}{100}\right) \times Vnbias,$$

where Dp is the density of the pulses of the PDM digital input signal, expressed as a percentage. The output voltage referred to here is the peak output voltage at the output of stage 810. In this example, since all stages apply the same gain of 1, it is also the peak output voltage at the subsequent stages.

Each of the intermediate filter stages 820, 821, etc., can be implemented using filter circuit 700 in FIG. 7, and is configured to perform the function of an intermediate filter stages 520, 521, etc., in FIG. 5.

The output filter stage 840 has a first switched-capacitor output filter 841 and a second switched capacitor output filter 842. The first switched-capacitor output filter 841 can be implemented using filter circuit 700 in FIG. 7, and is configured to perform the function of intermediate filter stages 520, 521, etc., in FIG. 5. The second switched-capacitor output filter 842 is similar to first switched-capacitor output filter 841, with the input being sampled using a different phase of the non-overlapping clock signals. In the first switched-capacitor output filter 841, the input signal from the previous stage is sampled using phase 1 (φ1) of the CMCLK clock signal to produce a non-inverting analog signal FILTEROUTP. However, in the second switched-capacitor output filter 842, the input signal from the previous stage is sampled using phase 2 (φ2) of the CMCLK clock signal to produce an inverting analog signal FILTEROUTP.

As described above, the multiple-stage switched-capacitor filter circuit 800 can include an input sampling filter stage and an output filter stage, and optionally, one or more intermediate filter stages. Each filter stage includes an MOSFET for receiving a bias current from a current source formed by a PMOS transistor. The filter stages are designed using a single NMOS device and a current source, allowing for minimal power dissipation. For each stage, the NMOS with PMOS current source then provides a DC gain of:

$$Adc = gmn \times \left(\frac{rdsn \times rdsp}{rdsp + rdsn}\right)$$

where:
gmn is the transconductance of the NMOS device,
rdsn is the output resistance of the NMOS device; and
rdsp is the output resistance of the PMOS device.

Each filter stage also includes a feedback capacitor Cfb coupling a drain and a gate of the MOSFET, a switching capacitor Csw coupled to the feedback capacitor, a sampling capacitor Cs coupled to the switching capacitor and the feedback capacitor. The switched capacitor Csw between the gate and drain nodes of the NMOS transistor forces the average drain and gate voltage to be equal. The fixed feedback capacitor Cfb will hold the gate charge and provides a low pass cut-off. Each stage also has a plurality of switches for coupling the sampling capacitor, the switching capacitor, and the feedback capacitor. Each filter stage provides a low-pass response with a cut-off frequency at about:

$$Fc = 1 \bigg/ \left(2\pi \times Cfb \times \frac{Tdmclk}{Csw}\right).$$

The last stage of the filter, the output filter stage 840, is made up of an inverting and a non-inverting stage by switching the input phase of the switching capacitor. The output voltages of the last stages are filtered by small RC filters 851 and 852 to remove glitches resulting from the switching of the switched capacitor filter stages to generate the filtered output signals FILTEROUTN & FILTEROUTP. Since each stage has an average drain and gate voltage that is equal and the NMOS device carries the same current and has the same properties of the reference device that provides Vnbias, the in-band output voltage can be described as:

$$FILTEROUTP = Vnbias \pm \left(2 \times \frac{Dp-50}{100}\right) \times Vnbias$$

and $$FILTEROUTN = Vnbias \pm \left(2 \times \frac{Dp-50}{100}\right) \times Vnbias,$$

where Dp is the density of the pulses of the PDM input signal in percentage from 0% to 100%.

In some embodiments, the multiple stage filter circuit, such as filter circuit 310 in FIG. 3 and filter circuit 800 in FIG. 8, can include two stages, an input sampling filter stage and an output filter stage. The multiple stage filter circuit can also include one or more intermediate filter stages. The filter stages can be used to restrict the bandwidth of the signal in the range of interest, for example, for voice or audio applications. For voice band applications, the bandwidth can be about 20 KHz. Increase in the number of filter stages can help to filter out ripples in the signal. In some embodiments, such as those described above, the filter stages each comprises of a single MOSFET gain stage, a MOSFET current source carrying a current Ibias and a switched capacitor network, the single MOSFET gain stage being biased at a current Ibias and having an average voltage of Vnbias at the drain and the gate connection, wherein Vnbias is a bias voltage derived from an external MOSFET gate voltage having drain and gate tied together and biased at a current Ibias.

Figure 9:
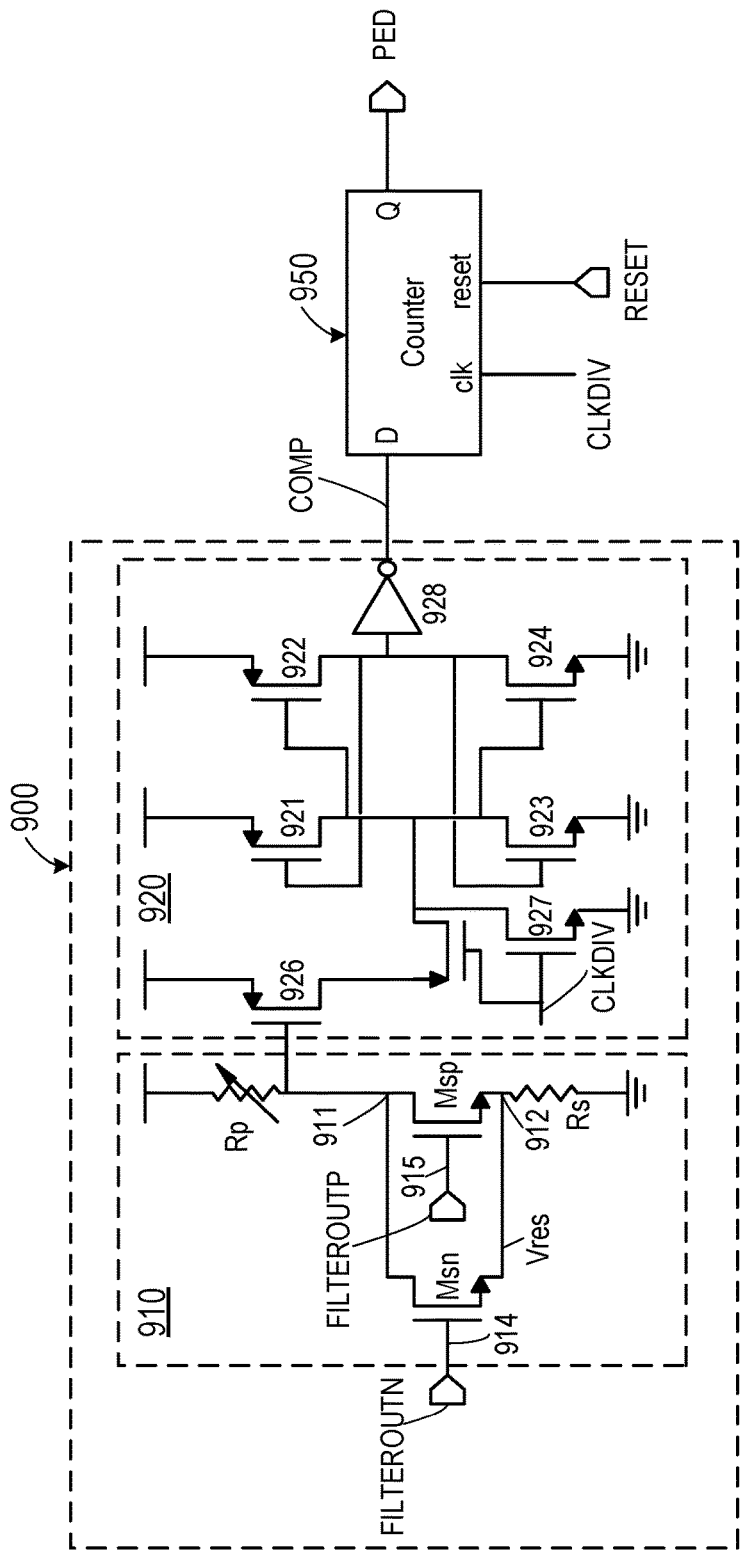
FIG. 9 is a circuit diagram illustrating a comparator circuit and a counter according to some embodiments of the present invention.

FIG. 9 is a circuit diagram illustrating a comparator circuit and a counter according to some embodiments of the present invention. Comparator circuit 900 in FIG. 9 is an example of a circuit that can be used as comparator circuit 320 in FIG. 3. Counter 950 is an example of counter circuit 330 in FIG. 3. As shown in FIG. 9, comparator 900 includes a comparator 910 and a latch 920. The comparator 910 includes first and second input NMOS transistors, Msn and Msp, coupled in parallel at drain terminals 911 and source terminals 912.

In some embodiments, transistors Msp and Msn are transistors identical to the NMOS FETs used in the filter stages. The first input NMOS transistor Msn has a gate terminal 914 for receiving the non-inverting output analog signal FILTEROUTN from the filter circuit. The second input NMOS transistor Msp has a gate terminal 915 configured for receiving the inverting output analog signal FILTEROUTP from the filter circuit. Comparator 900 also includes a source resistor Rs coupled to the source terminals 912 of the first and second input NMOS transistors and provides a voltage Vres that represents a rectified signal based on the non-inverting analog output signal FILTEROUTN and the inverting analog output signal FILTEROUTP. The two NMOS transistors, Msn and Msp, have the same properties as the Vnbias reference NMOS device (1130 in FIG. 11 to be described below). The AC voltage Vres can be approximately expressed as follows.

$$Vres = \left| \left( 2 \times \frac{Dp - 50}{100} \right) \times Vnbias \right|.$$

As shown in FIG. 9, latch 920 includes cross-coupled transistors 921, 922, 923, and 924. Latch 920 also includes a transistor 925 for receiving a triggering signal 918 from comparator 910. Latch 920 also includes transistors 926 and 927 for receiving clock signal CLKDIV. An inverter 928 is coupled to the cross-coupled transistors to provide an output signal COMP for latch 920. The latch 920 is configured to produce the pulsed signal COMP when a magnitude of the rectified signal Vres exceeds a threshold.

Comparator 900 also includes a programmable resistor Rp coupled to the drain terminals 911 of the first and second NMOS transistors for setting a threshold for triggering the latch 920. The AC current through the source resistor Rs is Vres/Rs. This signal current is fed into the programmable resistor Rp, which sets the threshold level. A strong PMOS device 926 in latch 920 is coupled to Rp to receive the voltage on the programmable resistor Rp. PMOS device 926 has a threshold voltage Vthp. As soon as the Rp voltage reaches Vthp, PMOS device 926 turns on. When the divided clock CLKDIV becomes 0, the cross-coupled latch changes states and the comparator output COMP becomes 1. The PDM pulse density threshold where the comparator trips then becomes the following:

$$Dp, th = \pm 100 \times \frac{Vthp \times Rs}{(2 \times Rp \times Vnbias)} + 50.$$

In FIG. 9, counter 950 can be implemented using a conventional digital counter, with an input data terminal D for receiving the COMP signal from comparator circuit 900, a clock input terminal "clk" for receiving the divided clock CLKDIV, a reset terminal "reset" to receive reset signal RESET. Counter 950 also has an output terminal Q for providing a PED signal, which is a PDM energy detection signal indicating that a certain pre-set count of COMP pulsed signals has been detected. At the rising edge of CLKDIV, the counter input D is latched and the counter is increased by 1. At the same time, the cross-coupled latch is reset. Once the counter reaches the maximum preset value, an output latch sets PED to 1. Then the processor wakes up and resets the counter. The pre-set count is a number of COMP pulsed signals that represent an amount of audio energy that would trigger the PDM energy detection signal. The pre-set count can be implemented by the design of counter 950. For example, the counter can be set up such that it can produce a PED output pulse when eight comparator output signals COMP are detected in four milliseconds.

Figure 10:
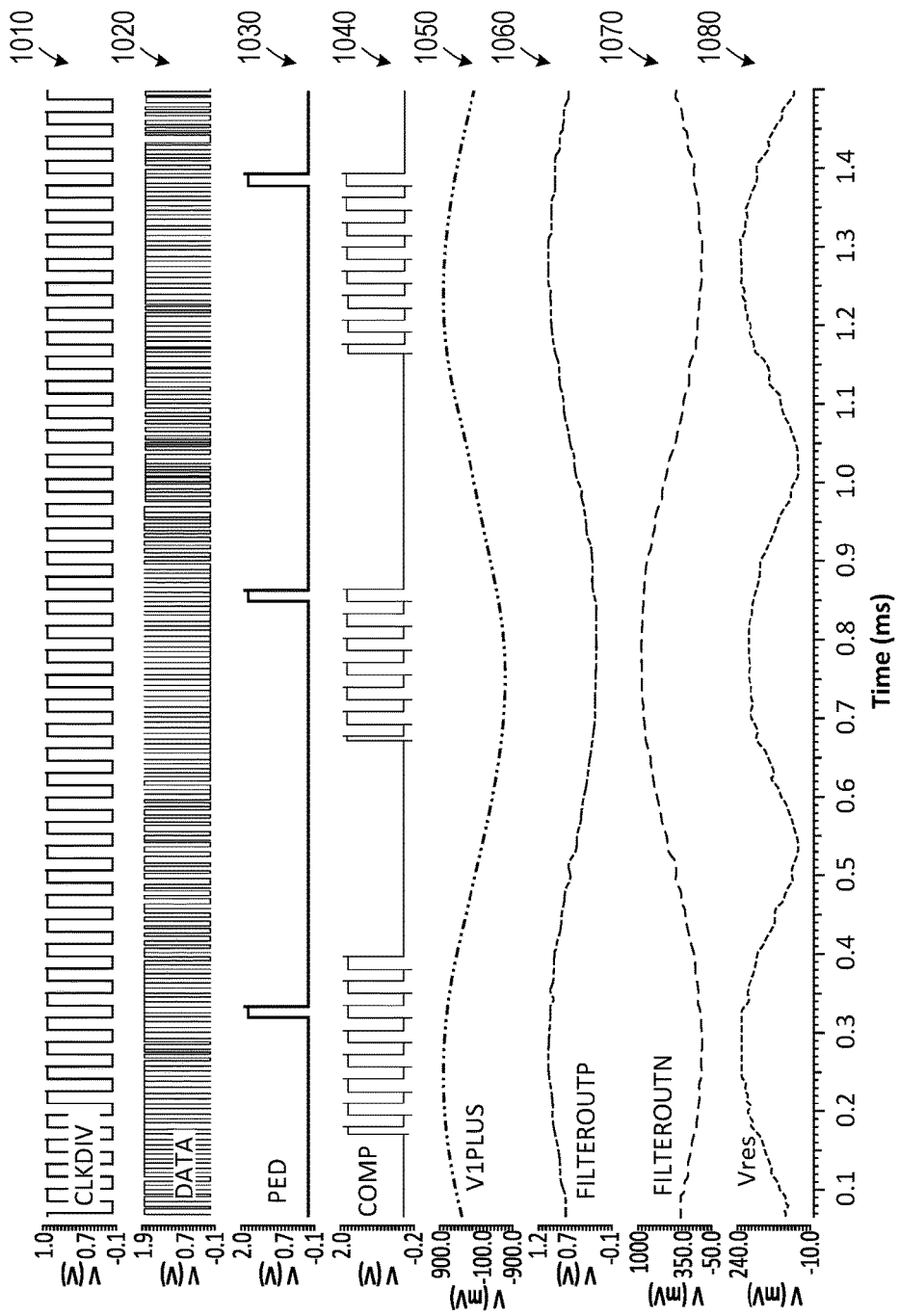
FIG. 10 is a waveform diagram illustrating waveforms of various signals used in the operation of the PDM signal energy detection circuits in some embodiments of the present invention.

FIG. 10 is a waveform diagram illustrating waveforms of various signals used in the operation of the PDM signal energy detection circuits in FIG. 3. In FIG. 10, waveform 1010 illustrates the divided clock signal CLKDIV. Waveform 1020 illustrates the PDM signal DMDATA produced by microphone module 110 based on the external audio signal represented by waveform 1050 below. Waveform 1030 illustrates the PED signal from the counter circuit 330 in FIG. 3, which indicates that the number of consecutive COMP signals has reached a pre-set count. Waveform 1040 illustrates the COMP signal output pulses from the comparator circuit 320 in FIG. 3, which indicates that the magnitude of the external audio signal exceeds a pre-set threshold. Waveform 1050 illustrates the VIPLUS signal that represents the strength of the external audio signal. Waveforms 1060 and 1070 illustrate the non-inverting and inverting output signals, FILEROUTP and FILTEROUTN, respectively. Waveform 1080 illustrates the Vres signal in the comparator circuit 910 in FIG. 9.

Figure 11:
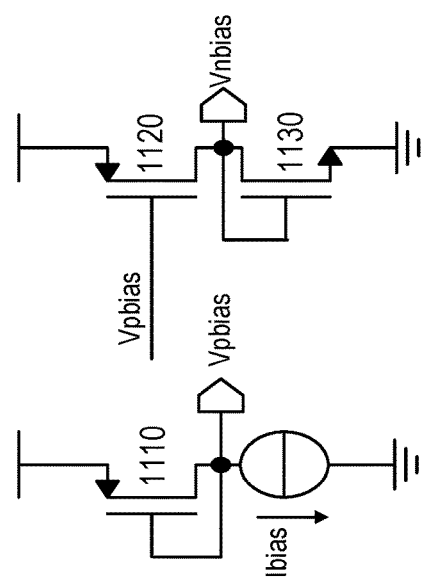
FIG. 11 is a simplified circuit diagram illustrating a voltage bias circuit according to some embodiments of the present invention.

FIG. 11 is a simplified circuit diagram illustrating a voltage bias circuit according to some embodiments of the present invention. As shown in FIG. 11, voltage bias circuit 1100 is an example of a circuit that can be used as bias circuit 340 in FIG. 3. Voltage bias circuit 1100 includes a first transistor 1110 with its gate and drain coupled together to receive a bias current Ibias. The first transistor 1110 provides an output voltage Vpbias. A second transistor 1120 is coupled to a third transistor 1130 in series. The second transistor 1120 receives the voltage Vpbias at its gate. The third transistor 1130 has its gate and drain coupled together and to the drain of transistor 1120 to provide an output voltage Vnbias. Thus, Vnbias is the gate to source voltage of a reference NMOS device receiving a fixed bias current and having the drain and gate tied together. In some embodiments, transistor 1130 is the same as the transistors in each filter stage of the multiple-stage filter circuit described above.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A PDM (pulse density modulation) signal energy detection circuit, comprising:
 a multiple-stage switched-capacitor filter circuit having multiple filter stages for receiving a PDM digital input signal, the multiple-stage switched-capacitor filter cir- cuit producing a non-inverting analog output signal and an inverting analog output signal based on the PDM digital input signal;

a comparator circuit for receiving the non-inverting analog output signal and the inverting analog output signal from the multiple-stage switched-capacitor filter circuit, the comparator circuit producing a pulsed signal when a magnitude of the non-inverting analog output signal or the inverting analog output signal exceeds a pre-set threshold; and a counter circuit receiving the pulsed signal from the comparator circuit and producing an energy detection signal when a number of consecutive pulsed signals exceeds a pre-set count;

wherein the filter stages each comprises of a single MOSFET gain stage, a MOSFET current source carrying a current Ibias and a switched capacitor network, the single MOSFET gain stage being biased at a current Ibias and having an average voltage of Vnbias at a drain and gate connection, wherein Vnbias is a bias voltage derived from an external MOSFET gate voltage having drain and gate tied together and biased at a current Ibias.

2. The circuit of claim 1, wherein the multiple-stage switched-capacitor filter circuit comprises:
an input sampling filter stage; and
an output filter stage.

3. The circuit of claim 2, wherein the input sampling filter stage is configured to sample an input voltage Vnbias through switches controlled by the PDM digital input signal; and
wherein the input sampling filter stage is configured to produce an output voltage of $$Vnbias \pm \left(2 \times \frac{Dp - 50}{100}\right) \times Vnbias,$$

where Dp is a density of pulses of the PDM digital input signal, expressed as a percentage.

4. The circuit of claim 2, wherein the input sampling filter stage comprises:
a feedback capacitor coupling a drain and a gate of the single MOSFET gain stage;
a switching capacitor coupled to the feedback capacitor;
a sampling capacitor coupled to the switching capacitor and the feedback capacitor; and
a plurality of switches for coupling the sampling capacitor, the switching capacitor, and the feedback capacitor;
wherein the sampling capacitor is configured to receive a PDM (pulse density modulation) digital data signal; and
wherein the input sampling filter stage is configured to produce an analog signal with a magnitude that is based on a density of the PDM digital input signal.

5. The circuit of claim 4, wherein the input sampling filter stage is configured to be a low-pass filter with a cut-off frequency of:

$$Fc = 1 \bigg/ \left(2\pi \times Cfb \times \frac{Tdmclk}{Csw}\right)$$

where:
Cfb is the capacitance of the feedback capacitor;
Csw is the capacitance of the switching capacitor; and
Tdmclk is a clock period of the PDM digital input signal.

6. The circuit of claim 2, wherein the output filter stage comprises:
a first switched capacitor output filter; and
a second switched capacitor output filter;
wherein the output filter stage is configured to receive an input signal from a previous stage and to produce the non-inverter output analog signal and the inverting analog output signal.

7. The circuit of claim 2, further comprising one or more intermediate filter stages coupled between the input sampling filter stage and the output filter stage, wherein each of the intermediate filter stages is a switched-capacitor low-pass filter.

8. The circuit of claim 7, wherein each of the one or more intermediate filter stages comprises:
a feedback capacitor coupling a drain and a gate of the single MOSFET gain stage;
a switching capacitor coupled to the feedback capacitor;
a sampling capacitor coupled to the switching capacitor and the feedback capacitor; and
a plurality of switches for coupling the sampling capacitor, the switching capacitor, and the feedback capacitor.

9. The circuit of claim 8, wherein each of the one or more intermediate filter stages is configured to be a low-pass filter with a cut-off frequency of:

$$Fc = 1 \bigg/ \left(2\pi \times Cfb \times \frac{Tdmclk}{Csw}\right)$$

where:
Cfb is the capacitance of the feedback capacitor;
Csw is the capacitance of the switching capacitor; and
Tdmclk is a clock period of the PDM digital input signal.

10. The circuit of claim 1, wherein each filter stage of the multiple-stage switched-capacitor filter circuit comprises:
a feedback capacitor coupling a drain and a gate of the single MOSFET gain stage;
a switching capacitor coupled to the feedback capacitor;
a sampling capacitor coupled to the switching capacitor and the feedback capacitor; and
a plurality of switches for coupling the sampling capacitor, the switching capacitor, and the feedback capacitor.

11. The circuit of claim 10, wherein each filter stage of the multiple-stage switched-capacitor filter circuit is configured to be a low-pass filter with a cut-off frequency of:

$$Fc = 1 \bigg/ \left(2\pi \times Cfb \times \frac{Tdmclk}{Csw}\right)$$

where:
Cfb is the capacitance of the feedback capacitor;
Csw is the capacitance of the switching capacitor; and
Tdmclk is a clock period of the PDM digital input signal.

12. The circuit of claim 1, wherein the comparator circuit comprises a comparator and a latch;
wherein the comparator includes:
first and second input NMOS transistors coupled in parallel at drain terminals and source terminals, the first input NMOS transistor having a gate terminal for receiving the non-inverting output analog signal, the second input NMOS transistor having a gate terminal configured for receiving the inverting output analog signal;

a source resistor coupled to the source terminals of the first and second input NMOS transistors and providing a voltage Vres that represents a rectified signal based on the non-inverting analog output signal or the inverting analog output signal; and a programmable resistor Rp coupled to the drain terminals of the first and second NMOS transistors; and wherein the latch is configured to produce the pulsed signal when a magnitude of the rectified signal exceeds a threshold.

13. A PDM (pulse density modulation) signal energy detection circuit, comprising:

a digital-to-analog converter circuit for receiving a PDM digital input signal and producing an analog output signal based on the PDM digital input signal;

a comparator circuit for receiving the analog output signal from the digital-to-analog converter circuit and producing a pulsed signal when a magnitude of the analog output signal exceeds a pre-set threshold; and a counter circuit for receiving the pulsed signal from the comparator circuit and producing an energy detection signal when a number of consecutive pulsed signals exceed a pre-set count;

wherein the digital-to-analog converter circuit comprises a single MOSFET gain stage, a MOSFET current source carrying a current Ibias and a switched capacitor network, the single MOSFET gain stage being biased at a current Ibias and having an average voltage of Vnbias at a drain and gate connection, wherein Vnbias is a bias voltage derived from an external MOSFET gate voltage having drain and gate tied together and biased at a current Ibias.

14. The circuit of claim 13, wherein the digital-to-analog converter circuit is configured to sample an input voltage Vnbias through switches controlled by the PDM digital input signal; and wherein the digital-to-analog converter circuit is configured to produce an output voltage of $$Vnbias \pm \left(2 \times \frac{Dp - 50}{100}\right) \times Vnbias,$$

where Dp is a density of pulses of the PDM digital input signal, expressed as a percentage.

15. The circuit of claim 13, wherein the digital-to-analog converter circuit comprises a switched-capacitor circuit that includes:

an MOSFET for receiving a bias current from a current source;

a feedback capacitor coupling a drain and a gate of the MOSFET;

a switching capacitor coupled to the feedback capacitor;

a sampling capacitor coupled to the switching capacitor and the feedback capacitor; and a plurality of switches for coupling the sampling capacitor, the switching capacitor, and the feedback capacitor;

wherein the sampling capacitor is configured to receive a PDM (pulse density modulation) digital data signal; and wherein the digital-to-analog converter is configured to produce an analog signal with a magnitude that is based on a density of the PDM digital data signal.

16. The circuit of claim 15, wherein the digital-to-analog converter circuit is configured to be a low-pass filter with a cut-off frequency of:

$$Fc = 1 \bigg/ \left(2\pi \times Cfb \times \frac{Tdmclk}{Csw}\right)$$

where:

Cfb is a capacitance of the feedback capacitor;

Csw is a capacitance of the switching capacitor; and

Tdmclk is a clock period of the PDM digital input signal.

17. The circuit of claim 15, wherein the digital-to-analog converter circuit is configured to produce a non-inverting analog output signal and an inverting analog signal.

18. A circuit for receiving a PDM digital input signal and producing an analog output signal based on the PDM digital input signal, comprising:

an MOSFET for receiving a bias current Ibias from a current source and having an average voltage of Vnbias at a drain and gate connection; and a plurality of capacitors coupled to the MOSFET;

wherein the circuit is configured to sample an input voltage Vnbias through switches controlled by the PDM digital input signal, wherein Vnbias is a bias voltage derived from a gate-to-source voltage of an external MOSFET having drain and gate tied together and biased at a current Ibias; and wherein the circuit is configured to produce an analog output voltage with a magnitude that is based on a density of the PDM digital input signal, the analog output voltage having an expression:

$$Vnbias \pm \left(2 \times \frac{Dp - 50}{100}\right) \times Vnbias,$$

where Dp is a density of pulses of the PDM digital input signal, expressed in a percentage.

19. The circuit of claim 18, further comprising:

a feedback capacitor coupling a drain and a gate of the MOSFET;

a switching capacitor coupled to the feedback capacitor;

a sampling capacitor coupled to the switching capacitor and the feedback capacitor;

and a plurality of switches for coupling the sampling capacitor, the switching capacitor, and the feedback capacitor.

20. The circuit claim 19, wherein the circuit is configured to be a low-pass filter with a cut-off frequency of:

$$Fc = 1 \bigg/ \left(2\pi \times Cfb \times \frac{Tdmclk}{Csw}\right)$$

where:

Cfb is the capacitance of the feedback capacitor;

Csw is the capacitance of the switching capacitor; and

Tdmclk is a clock period of the PDM digital input signal.

* * * * *